(12) United States Patent
Rigimbal et al.

(10) Patent No.: US 6,937,475 B2
(45) Date of Patent: Aug. 30, 2005

(54) MOUNTING AND GROUNDING ASSEMBLY FOR CIRCUIT BOARD MOUNTED PARALLEL TO CHASSIS BOTTOM

(75) Inventors: Laurent A. Rigimbal, Round Rock, TX (US); Christopher L. Holderness, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 113 days.

(21) Appl. No.: 10/654,736

(22) Filed: Sep. 4, 2003

(65) Prior Publication Data

US 2005/0052857 A1 Mar. 10, 2005

(51) Int. Cl.⁷ .................. H05K 5/02; H05K 7/12; H05K 7/14
(52) U.S. Cl. ............ 361/752; 361/753; 361/799; 361/809; 361/796; 361/807; 174/52.1
(58) Field of Search ............... 361/742, 758, 361/770, 802, 807–810, 804, 752, 753, 796–799; 174/50, 52.1, 138 G; 211/41.17; 312/223.2, 223.3

(56) References Cited

U.S. PATENT DOCUMENTS

| | | | | |
|---|---|---|---|---|
| 5,647,748 A | | 7/1997 | Mills et al. ................ 439/81 |
| 5,691,504 A | * | 11/1997 | Sands et al. ............... 174/35 R |
| 5,730,515 A | * | 3/1998 | Ho ............................. 312/350 |
| 5,801,928 A | * | 9/1998 | Burstedt et al. ............ 361/801 |
| 5,999,416 A | * | 12/1999 | McAnally et al. .......... 361/816 |
| 6,075,694 A | * | 6/2000 | Mills et al. ................ 361/685 |
| 6,191,953 B1 | * | 2/2001 | Aggus et al. ............... 361/796 |
| 6,215,667 B1 | | 4/2001 | Ady et al. .................. 361/752 |
| 6,238,026 B1 | * | 5/2001 | Adams et al. ........... 312/223.2 |
| 6,347,044 B1 | | 2/2002 | Won et al. .................. 361/807 |
| 6,404,646 B1 | * | 6/2002 | Tsai et al. ................... 361/758 |
| 6,424,537 B1 | | 7/2002 | Paquin et al. ............... 361/752 |
| 6,424,538 B1 | * | 7/2002 | Paquin ....................... 361/752 |
| 6,525,266 B2 | | 2/2003 | Ferland et al. .............. 174/35 |
| 6,537,084 B2 | | 3/2003 | Casey et al. ............... 439/76.1 |
| 6,544,047 B2 | * | 4/2003 | Moore ........................ 439/95 |
| 6,751,102 B1 | * | 6/2004 | Chen .......................... 361/758 |
| 2002/0129954 A1 | | 9/2002 | Griffis ........................ 174/50 |
| 2002/0181212 A1 | | 12/2002 | Paquin et al. ............... 361/752 |
| 2002/0181219 A1 | | 12/2002 | Paquin et al. ............... 361/809 |

\* cited by examiner

*Primary Examiner*—Phuong T. Vu
*Assistant Examiner*—Dameon E. Levi
(74) *Attorney, Agent, or Firm*—Baker Botts L.L.P.

(57) ABSTRACT

A computer chassis having tabs extending from the inside of its side panels and springs extending from the bottom panel, for spring-mounting a circuit board, such as a motherboard or other circuit board oriented parallel to the bottom surface of the chassis. The tabs and springs may also be used to ground the circuit board.

18 Claims, 3 Drawing Sheets

MOUNTING AND GROUNDING ASSEMBLY FOR CIRCUIT BOARD MOUNTED PARALLEL TO CHASSIS BOTTOM

TECHNICAL FIELD

This invention is related to computer systems, and more particularly to a chassis for a computer.

BACKGROUND

A computer chassis houses the main electronic components of the computer, including the motherboard, power supply, cooling system, and optional adapters, such as adapters that provide audio or video or networking capabilities. Typically, room is also provided for data storage, such as a hard disk or CD-ROM drive.

The chassis fulfills several functions. In addition to simply housing and protecting the electrical and mechanical components, it provides a mounting structure to which the components are secured in accordance with a design that efficiently interconnects them. It also provides a barrier for electromagnetic interference (EMI) caused by electromagnetic fields generated inside or outside the chassis.

Computer chassis designs often incorporate hooks, tabs, channels, screws, or the like for mounting circuit boards inside the chassis. These mounting methods often result in a reduction of useful surface area of the circuit board.

SUMMARY

One aspect of the invention is a chassis for containing a computer and for mounting a horizontally oriented circuit board. The chassis is designed for a circuit board having small notches cut from its perimeter. The chassis may be various shapes, but in general, has a flat bottom and opposing parallel side panels. The distance between these side panels is only slightly greater than the width of the circuit board. Each side panel has at least one tab protruding from its inner surface. Each tab is slightly and laterally offset from a location on the side panel opposing one of the notches in the circuit board when the circuit board is mounted within the chassis. The bottom panel of the chassis has springs extending from its inner surface.

For installing the circuit board, the notches of the circuit board are placed directly over the tabs. The circuit board is then lowered past the tabs and laterally shifted such that the springs are compressed and hold the circuit board against the tabs.

The chassis, including the tabs and springs, is electrically conductive. The tabs and springs contact grounding pads on the upper and lower surfaces of the circuit board, respectively, to provide grounding for the circuit board.

An advantage of the invention is that it provides good mounting and grounding while reducing the useful board surface area as little as possible. It provides an EMI ground path on both the top and the bottom of the circuit board, while at the same time, providing maximum surface area for mounting components on the circuit board. No holes are required to be drilled through the circuit board. Instead, small notches are placed in the perimeter of the board, in a location that is typically a "keep out" (non-populated) portion of the board.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
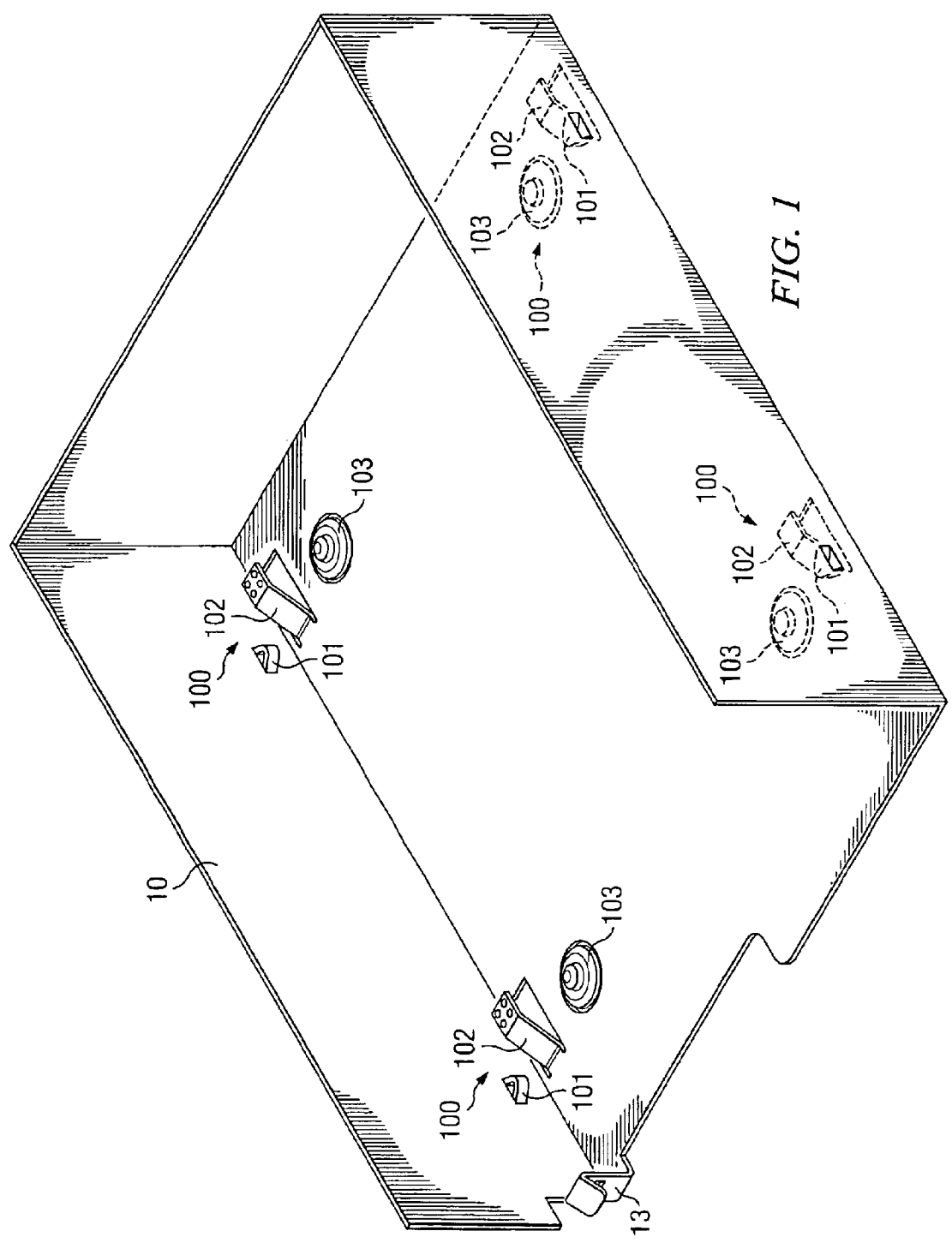
FIG. 1 illustrates a computer chassis having four circuit board mounting assemblies in accordance with the invention.

FIG. 1 illustrates a computer chassis 10 having four circuit board mounting assemblies 100 in accordance with the invention. As explained below, assemblies 100 receive a motherboard (not shown in FIG. 1) or any other circuit board that is oriented parallel to the bottom surface of the chassis.

Chassis 10 is essentially a rectangular box, made from a rigid material, such as sheet metal. It has six planer surfaces, namely, a bottom, top, two side panels, a front panel, and a back panel. In FIG. 1, the front panel is removed, in preparation for installation of circuit boards and other internal components. The invention is also applicable for installation of these components with the top panel removed.

The chassis material is conductive, and provides a grounding sink for the internal components. In other embodiments, rather than being box-shaped, chassis 10 could have some other closed shape, regular or irregular, but will have a flat bottom and two parallel sides. Various equivalent chassis shapes can be envisioned having opposing sides that are at least partly parallel, with the circuit board to be mounted in that portion of the chassis.

In the example of FIG. 1, chassis 10 has four circuit board mounting assemblies 100, one near each inner corner of chassis 10. Each assembly 100 has a tab 101 on the inside surface of a side wall of chassis 10, and a proximately located grounding spring 102 on the inside bottom surface of chassis. As explained below, a circuit board may be mounted between tabs 101 and springs 102 of the assemblies 100.

The number of assemblies 20 illustrated in FIG. 1 is convenient for mounting a board that fits inside chassis 10 over the entire bottom of chassis 10. However, this number of assemblies 100 is for purposes of illustration only. More or fewer assemblies could be used, and not all need be used for mounting a particular circuit board. Their location could be anywhere along two opposing and parallel sides of chassis 10.

In the example of this description, tabs 101 are formed by stamping the sheet metal that comprises the side of chassis 10. Such features are often referred to as "form features". In the example of FIG. 1, the stamping process for each tab 101 creates a metal strip stamped inward from the side panels, and resulting in the triangular shaped tab 101 and leaving a corresponding opening in the side of chassis 10.

In other embodiments, tabs 101 could be fabricated as a separate piece and attached to the inner surface of chassis 10. In general, tabs 101 may be any shape, with a common feature being that they protrude from the inner surface of the side of chassis 10 and are operable to hold down a board that is oriented parallel to the bottom surface of the chassis 10 when installed, as further explained below. For example, tabs 101 could be flat and/or rectangular.

Tabs 101 may be quite small. For example, tabs 101 having dimensions of 0.140 inch by 0.200 inch would be suitable for a chassis 10 whose motherboard is approximately 16×18 inches.

Board standoffs 103 are punched from, or attached to the bottom surface of chassis 10. Their purpose is to prevent the installed circuit board (shown in FIG. 2) from being pushed too far down toward the bottom of chassis 10. Instead, as explained below, the board is suspended by springs 102. To this end, the height of the top of springs 102 is higher than the height of standoffs 103. With a sufficiently stiff spring constant of springs 101, however, standoffs 103 may not be required.

Figure 2:
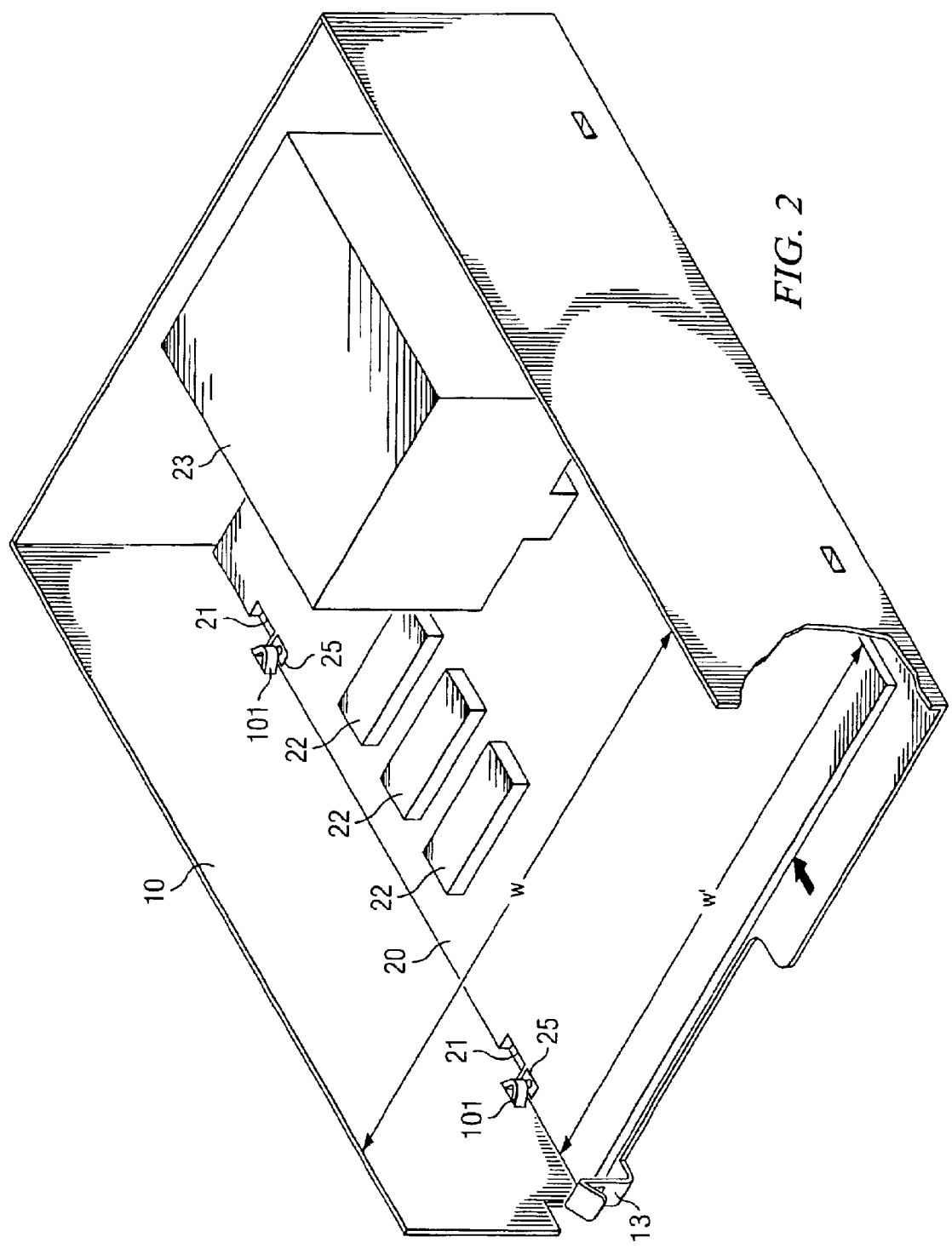
FIG. 2 illustrates the computer chassis having a circuit board mounted inside, using the assemblies of FIG. 1.

FIG. 2 illustrates chassis 10 having a circuit board 20 mounted inside, using assemblies 100 in accordance with the invention. Circuit board 20 has a notch 23 corresponding to each tab 101. Notches 23 are slightly offset from tabs 101, when board 20 is installed. Various representative components typically mounted on circuit board 20 are also shown, such as integrated circuit chips 22 and heat sinks 23.

As may be easily understood by reference to FIG. 2, the inner width (w) between the sides of the chassis 10 is only slightly larger than the width (w') of the circuit board 20. Circuit board 20 is mounted by placing it inside chassis 10 with each notch 21 directly positioned above a corresponding tab 101. The board 20 may then be lowered so that the notches 21 are below the tabs 101. Next, board 20 is shifted relative to chassis 10, so that each tab 101 is slightly to the side of each notch 21. In the example of FIG. 2, board 20 has been lowered so that tabs 101 fit through notches 21, and then board 20 has been shifted in the direction of the arrow to its proper location in chassis 10.

Notches 21 are placed along the edges of board 20, and need not be large in size. As stated above, tabs 101 are small, and notches need only be slightly larger. The small size of notches 21 results in their being all, or substantially all, in an area of circuit board 20 that is not typically populated with components.

A grounding pad 25 is adjacent each notch 21, along the edge of board 20. Grounding pads 25 are positioned such that when circuit board 20 is shifted into place as described herein, tab 101 will be directly above grounding pad 25. A metal-to-metal contact between tab 101 and grounding pad 25 provides grounding for circuit board 20. Grounding pad 25 need not be large—in the example of this description, its length and width are substantially the same as the length and width of tab 101.

In the example of FIG. 2, board 20 has dimensions (length and width) that substantially conform to the bottom surface area of chassis 10. However, smaller boards could be mounted in the same manner. A typical arrangement of mounting assemblies 100 would be one at each corner of board 10, but as stated above, more or fewer could be used.

In the example of this description, circuit board 20 is a "motherboard", that is, a board populated with a processor, RAM, and perhaps other chips for implementing the primary processing functions. However, circuit board 20 need not be a "motherboard"—it may be any circuit board mounted parallel to the bottom surface of chassis 10, slightly above the bottom surface of chassis 10.

Figure 3:
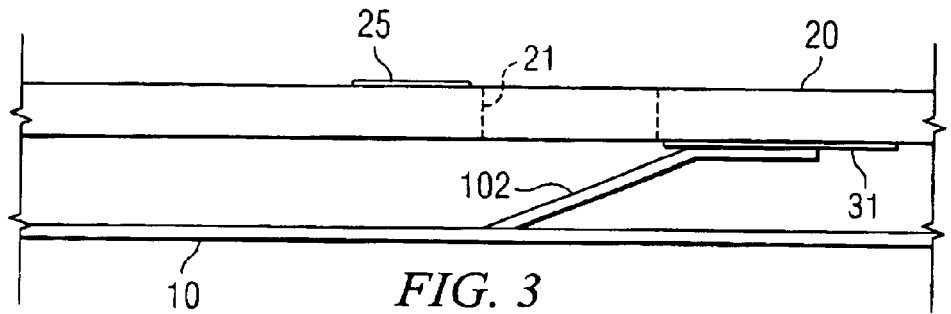
FIG. 3 is a side cut-away view of the computer chassis with one side removed and with the circuit board mounted in place.

FIG. 3 is a side cut-away view of a portion of chassis 10 with one side removed and with circuit board 20 mounted in place. Only the bottom panel of chassis 10 is shown. Because the side of chassis 10 is removed, tab 101 is not shown in FIG. 3. Upper ground pad 25 is visible on the top surface of board 20, as well as notch 21.

Referring to both FIGS. 1 and 3, a grounding spring 102 has a fixed end on the bottom surface of chassis 10 and a free end extending upwardly from the bottom surface, and is generally cantilevered in shape. The free end of spring 102 is not attached to board 20, but rather the bottom of board 20 rests on the top of spring 20. The contacting (top) portion of spring 201 may be extended or broadened to provide as much contact area as is desired.

Spring 102 is constructed from a conductive material, such as a metal, having properties that permit the free end of spring 102 to move in an upward or downward direction in a spring-like manner. A possible design for spring 102 is as a form feature, stamped into the sheet metal that forms the bottom of chassis 10. Alternatively, spring 102 could be a separate piece, attached to the bottom surface of chassis 10.

In FIG. 3, board 20 is in place, having been lowered so that tab 101 passes through notch 21 and then shifted so that tab 101 is over upper ground pad 25. When board 20 has been installed in this manner, spring 102 is compressed. The distance, x, between the fixed end of spring 102 and the free end is smaller than it would be if board were not installed.

The pressure of spring 202 against the bottom of board 20 results in upper grounding pad 25 being pushed upwardly against the bottom of tab 201. This provides grounding for the top of board 20.

Lower ground pads 31 are located on the bottom surface of board 20. They may be any convenient size, but are located such that they contact the top of springs 202 when board 20 is installed. In this example, lower ground pads 31 are substantially the same rectangular shape and size as upper ground pads 31. By contacting ground pads 31, springs 102 provide a conductive connection from circuit board 20 to the bottom of chassis 10.

Like upper ground pads 25, lower ground pads 31 are conductive. Pads 25 and 31 may be easily fabricated on board 20 during the metallization phase of fabrication, in a manner similar to the fabrication of solder pads.

In the example of this description, each tab 101 is located close to a spring 102 within chassis 10. Likewise, each upper ground pad 25 is located close to a lower ground pad 31 on opposing sides of board 20. However, this is not necessary, so long as tabs 101 are located such that they will contact upper ground pads 25 and springs 102 are located such that they will contact lower ground pads 31 when circuit board 20 is installed. In other words, the contacting tab 101 and upper ground pad 25 may be displaced from the contacting spring 102 and lower ground pad 31.

Figure 4:
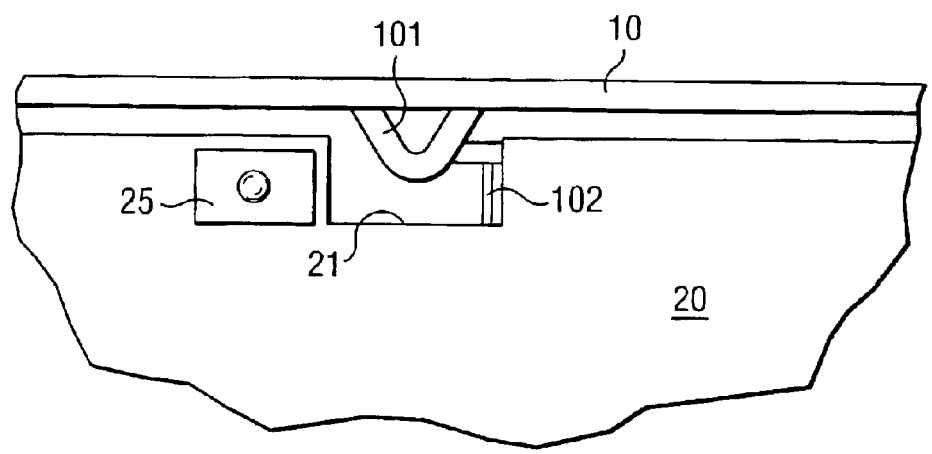
FIG. 4 is a top plan view of a tab positioned directly over a notch during the installation of a circuit board.
Figure 5:
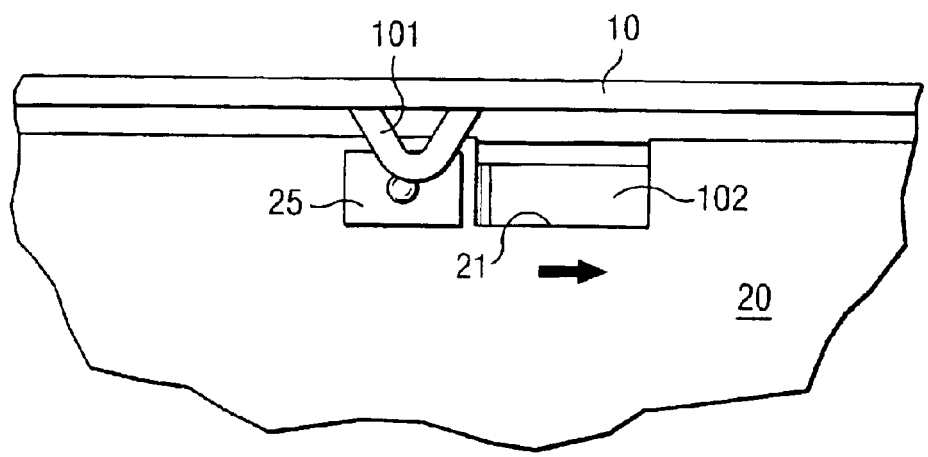
FIG. 5 is a top plan view of the tab positioned over the grounding pad, after the circuit board is lowered and laterally shifted from the position of FIG. 4.

FIGS. 4 and 5 are top plan views of a tab 101 extending from the side of chassis 10, and further illustrate the process of installing a circuit board 20 within chassis 10. Only the portion of circuit board 20 in the area of tab 101 is shown. In FIG. 4, the circuit board 20 has been lowered down into chassis 10, with tab 101 passing through notch 21. The board 20 was initially placed so that notch 21 was directly above tab 101, then lowered so that tab 101 passed through notch 21. In FIG. 5, the board 20 has been shifted laterally in the direction of the arrow, so that tab 101 is over grounding pad 25. As explained above, as a result of the upward pushing action of the underlying spring 101, the contact between tab 101 and grounding pad 25 is snug. If desired, the top surface of spring 102 may have raised bumps or other patterning to ensure a multi-point contact, or to otherwise facilitate good grounding.

Referring again to FIG. 1, a lock spring 13 is attached to the front edge of chassis 10. In other embodiments, the lock spring may be attached to the back edge, or to both the front and back edges. During installation of board 20, spring 13 is depressed so as to permit board 20 to be lowered and shifted into place as described above. Once board 20 is properly situated, spring 13 is released and is operable to hold board 20 in place, with each tab 101 contacting its associated upper grounding pad 25 and with each spring 102 contacting its associated lower grounding pad 31.

Although the disclosed embodiments have been described in detail, it should be understood that various changes, substitutions and alterations can be made to the embodiments without departing from their spirit and scope.

What is claimed is:

1. A chassis for containing a computer, and for mounting a circuit board oriented parallel to the bottom surface of the chassis and having notches cut from its perimeter, comprising:

two parallel side panels on opposing sides of the chassis, each side panel having at least one tab protruding from its inner surface, each tab being slightly and laterally offset from a location on the side panel opposing one of the notches in the circuit board when the circuit board is mounted within the chassis; and a planar bottom panel, having springs extending from its inner surface;

wherein the distance between the side panels is only slightly greater than the width of the circuit board, such that the notches of the circuit board may be placed over the tabs, and the circuit board lowered under the tabs and laterally shifted such that the springs are compressed and hold the circuit board against the tabs.

2. The chassis of claim 1, wherein the side panels, bottom panels, tabs, and springs are made from an electrically conductive material.

3. The chassis of claim 1, wherein the chassis is rectangular.

4. The chassis of claim 1, wherein the tabs are formed by stamping a form feature in the sides of the chassis.

5. The chassis of claim 1, wherein the springs are formed by stamping a form feature in the sides of the chassis.

6. The chassis of claim 1, wherein the side panels and the tab are made from electrically conductive material, and wherein the circuit board has at least one upper grounding pad and at least one tab is located such that it contacts the upper grounding pad when the circuit board is mounted in the chassis.

7. The chassis of claim 1, wherein the side panels and the springs are made from electrically conductive material, and wherein the circuit board has at least one lower grounding pad and at least one spring is located such that it contacts the lower grounding pad when the circuit board is mounted in the chassis.

8. The chassis of claim 1, wherein the springs are located near the sides of the chassis.

9. The chassis of claim 1, wherein the springs are located proximate the tabs.

10. The chassis of claim 1, further comprising one or more standoffs on the bottom panel of the chassis.

11. The chassis of claim 1, wherein each of the springs is made from a strip of metal extending diagonally upward from the bottom panel.

12. The chassis of claim 1, wherein the tabs are triangular strips, stamped inward from the side panels.

13. The chassis of claim 1, wherein the springs are metal strips, stamped inward from the bottom panel.

14. A method of mounting a circuit board oriented parallel to the bottom surface of a chassis, within a chassis having at least two opposing parallel sides, comprising the steps of:

cutting notches in the perimeter of the circuit board;

providing tabs in the opposing parallel sides of the chassis, the tabs protruding from the inner surface of the sides to a distance that permits them to pass through the notches when the circuit board is positioned above the tabs and lowered;

providing springs on the bottom of the chassis, such that if the circuit board is positioned above the tabs, lowered, and laterally shifted, the springs push the board against the tabs;

positioning the circuit board directly above the tabs;

lowering the circuit board below the tabs; and shifting the circuit board laterally such that the tabs are no longer directly above the notches.

15. The method of claim 14, wherein the chassis is at least partly made from an electrically conductive material, and further comprising the step of providing at least one upper grounding pad on the circuit board that contacts at least one tab.

16. The method of claim 14, wherein the chassis is at least partly made from an electrically conductive material, and further comprising the step of providing at least one lower grounding pad on the circuit board that contacts at least one spring.

17. A circuit board suitable for mounting within a computer chassis parallel to the bottom surface of the chassis, the chassis having a plurality of tabs protruding from opposing side panels and a plurality of springs protruding from its bottom panel;

a circuit board base having a plurality of notches in its perimeter and having a width slightly less than the distance between the side panels;

at least one upper grounding pad located on the top surface of the base, near the perimeter of the base, such that the upper grounding pad contacts a tab when the circuit board is mounted in the chassis; and at least one lower grounding pad located on the bottom surface of the base, such that the lower grounding pad contacts a spring when the circuit board is mounted in the chassis.

18. The circuit board of claim 17, wherein the notches are entirely located in a "keep out" area of the base.

* * * * *

UNITED STATES PATENT AND TRADEMARK OFFICE
CERTIFICATE OF CORRECTION

PATENT NO. : 6,937,475 B2
DATED : August 30, 2005
INVENTOR(S) : Regimbal et al.

It is certified that error appears in the above-identified patent and that said Letters Patent is hereby corrected as shown below:

Title page,
Item [75], Inventors, delete "Rigimbal" and replace with -- Regimbal --.

Signed and Sealed this

Twenty-ninth Day of November, 2005

JON W. DUDAS
*Director of the United States Patent and Trademark Office*